United States Patent
Chen et al.

(10) Patent No.: US 10,036,823 B2
(45) Date of Patent: Jul. 31, 2018

(54) SYSTEM FOR MONITORING AND EARLY WARNING OF STRUCTURAL COLLAPSE AND METHOD THEREOF

(71) Applicant: National Central University, Taoyuan (TW)

(72) Inventors: Chien-Chih Chen, Taoyuan (TW); Yi-Heng Li, Taoyuan (TW)

(73) Assignee: National Central University, Taoyuan (TW)

(*) Notice: Subject to any disclaimer, the term of this patent is extended or adjusted under 35 U.S.C. 154(b) by 130 days.

(21) Appl. No.: 15/174,499

(22) Filed: Jun. 6, 2016

(65) Prior Publication Data

US 2017/0146678 A1    May 25, 2017

(30) Foreign Application Priority Data

Nov. 25, 2015 (TW) .............................. 104139250 A

(51) Int. Cl.
| | |
|---|---|
| *G01V 3/08* | (2006.01) |
| *G01R 29/24* | (2006.01) |
| *G01R 29/14* | (2006.01) |
| *G01V 3/38* | (2006.01) |

(52) U.S. Cl.
CPC ............... *G01V 3/088* (2013.01); *G01V 3/08* (2013.01); *G01R 29/14* (2013.01); *G01R 29/24* (2013.01); *G01V 3/38* (2013.01)

(58) Field of Classification Search
CPC ........ G01R 29/00; G01R 29/12; G01R 29/14; G01R 29/24; G01R 5/00; G01R 5/28; G01R 15/165; G01R 19/00; G01R 19/0023; G01V 3/00; G01V 3/08; G01V 3/088; G01V 3/38
USPC ....................................................... 324/457
See application file for complete search history.

(56) References Cited

U.S. PATENT DOCUMENTS

| | | | | | |
|---|---|---|---|---|---|
| 5,184,516 | A | * | 2/1993 | Blazic | G01B 7/16 324/718 |
| 5,850,185 | A | * | 12/1998 | Canty | E04B 1/98 250/222.1 |
| 7,006,822 | B2 | * | 2/2006 | Kashu | H04M 1/72519 455/404.2 |
| 2006/0032313 | A1 | * | 2/2006 | Austin | G01H 1/00 73/587 |
| 2008/0060298 | A1 | * | 3/2008 | Fahim | E04C 5/07 52/309.14 |
| 2009/0309742 | A1 | * | 12/2009 | Alexander | G08B 21/10 340/601 |
| 2010/0109944 | A1 | * | 5/2010 | Whitehead | G01C 15/00 342/357.25 |
| 2011/0133954 | A1 | * | 6/2011 | Ooshima | G08G 1/096716 340/905 |

(Continued)

*Primary Examiner* — Hoai-An D Nguyen
(74) *Attorney, Agent, or Firm* — Muncy, Geissler, Olds & Lowe, P.C.

(57) ABSTRACT

A method for monitoring and early warning of structural collapse, having following steps of: installing at least one electric field sensor in a monitoring area, wherein the at least one electric field sensor is used for measuring an electric field signal of the monitoring area; receiving the electric field signal and applying a signal analysis to the electric field signal; and issuing a warning signal when a critical transition feature occurs in the electric field signal to which the signal analysis is applied.

17 Claims, 17 Drawing Sheets

(56) References Cited

U.S. PATENT DOCUMENTS

| | | | |
|---|---|---|---|
| 2011/0245702 A1* | 10/2011 | Clark | A61B 5/04284 |
| | | | 600/523 |
| 2012/0318056 A1* | 12/2012 | Izumi | G01P 15/00 |
| | | | 73/146.3 |
| 2016/0159279 A1* | 6/2016 | Mori | B60Q 9/001 |
| | | | 340/438 |
| 2016/0170814 A1* | 6/2016 | Li | G06F 9/542 |
| | | | 719/318 |
| 2017/0110002 A1* | 4/2017 | Jean-Jerome | A62C 99/00 |

* cited by examiner

SYSTEM FOR MONITORING AND EARLY WARNING OF STRUCTURAL COLLAPSE AND METHOD THEREOF

FIELD OF THE INVENTION

The present invention relates to a system for monitoring and early warning of structural collapse and method thereof, especially a system for monitoring and early warning of structural collapse and method thereof by measuring and analyzing an electric field signal and its critical transition feature.

BACKGROUND OF THE INVENTION

Taiwan is located in the Circum-Pacific Volcanic Belt (the Ring of Fire) which belongs to an area with frequent earthquakes. The island has many active faults. Its geology is originally relatively fragile. In addition to the impact of many typhoons and high rainfall, there often results in many disasters. These disasters include the mass wasting phenomenon. The main mass wasting includes: landslide, rockfall, wedge sliding, toppling failure, debris flow and etc. Furthermore, the collapse of bridges and piers, and the collapse of the walls of the buildings or other artificial structures, etc. are also a kind of mass wasting. One of the main factors of mass wasting phenomenon is the impact of gravity. Others such as the water content of rocks, weathering and earthquakes will also accelerate mass wasting. The most common mass wasting is rockfall of roadside slope, which seriously threatens traffic safety, especially in the Su-Hua Highway, Taroko and other sections etc. where the accident of vehicles or pedestrians hit by rockfall often occurs. In addition, the rupture of the old bridges and piers in a sudden may also cause serious accidents. Therefore, it is very important for protecting the safety of pedestrians and vehicles if roadside slope, retaining wall, bridge piers, bridges, and etc. may be monitored and an early warning may be issued prior to the occurrence of disasters of mass wasting. Today, however, there is no any technique which may predict the occurrence of the mass wasting, such as rockfall of side-slope, collapse of piers and etc.

Accordingly, applicant has developed a system for monitoring and early warning of structural collapse and method thereof, which may detect the feature of collapse before the occurrence of disasters of mass wasting and therefore may issue an early warning in advance. Therefore, the present invention then has been invented.

SUMMARY OF THE INVENTION

The main technical problem the present invention seeking to solve is to detect the feature of collapse before the occurrence of disasters of mass wasting and therefore may issue an early warning in advance to reduce the risk of disasters from threatening human beings.

In order to solve the problem mentioned the above and to achieve the expected effect, the present invention provides a method for monitoring and early warning of structural collapse, which comprising following steps of: installing at least one electric field sensor in a monitoring area, wherein the at least one electric field sensor is used for measuring an electric field signal of the monitoring area; receiving the electric field signal and applying a signal analysis to the electric field signal; and issuing a warning signal when a critical transition feature occurs in the electric field signal to which the signal analysis is applied.

In an embodiment of the method for monitoring and early warning of structural collapse, wherein the signal analysis includes a Morlet transform or an enhanced Morlet transform.

In an embodiment of the method for monitoring and early warning of structural collapse, wherein the signal analysis includes at least one of a skewness calculation and a kurtosis calculation.

In an embodiment of the method for monitoring and early warning of structural collapse, wherein the critical transition feature includes at least one feature selected from the group consisting of (1)~(8): (1) an intensity of the electric field signal reaches an intensity threshold; (2) an intensity of the electric field signal is continuously greater than a continuous intensity threshold within a continuous time period; (3) an integral value of an intensity of the electric field signal with respect to a time interval reaches an integral value threshold; (4) an integral value of an intensity of the electric field signal with respect to an unit time reaches an unit time integral value threshold; (5) an absolute value of a skewness of an intensity of the electric field signal reaches a skewness threshold; (6) an absolute value of a skewness of an intensity of the electric field signal is continuously greater than a continuous skewness threshold within a continuous skewness time period; (7) a kurtosis of an intensity of the electric field signal reaches a kurtosis threshold; and (8) a kurtosis of an intensity of the electric field signal is continuously greater than a continuous kurtosis threshold within a continuous kurtosis time period.

In an embodiment of the method for monitoring and early warning of structural collapse, wherein the critical transition feature is occurred in the electric field signal within a characteristic frequency range.

In an embodiment of the method for monitoring and early warning of structural collapse, wherein the characteristic frequency range is greater than 0.008 Hz and smaller than 1 Hz.

In an embodiment of the method for monitoring and early warning of structural collapse, wherein the monitoring area is a side-slope, a roadside slope, a retaining wall or a bridge pier.

In addition, the present invention further provides a system for monitoring and early warning of structural collapse comprising a detecting unit, a data processing unit and a warning unit. The detecting unit includes at least one electric field sensor, wherein the at least one electric field sensor is installed in a monitoring area, the at least one electric field sensor is used for measuring an electric field signal of the monitoring area. The data processing unit receives the electric field signal through wired or wireless transmission, applies a signal analysis to the electric field signal, and issues a warning signal when a critical transition feature occurs in the electric field signal to which the signal analysis is applied. The warning unit receives the warning signal to execute the operation of the warning unit.

In an embodiment of the system for monitoring and early warning of structural collapse, wherein the detecting unit further comprises at least one transmitter, the electric field signal is transmitted to the data processing unit by the at least one transmitter through wired or wireless transmission.

In an embodiment of the system for monitoring and early warning of structural collapse, further comprising at least one transmission repeater station, wherein the electric field signal is transmitted to the data processing unit by the at least one transmitter and the at least one transmission repeater station through wired or wireless transmission.

In an embodiment of the system for monitoring and early warning of structural collapse, wherein the at least one transmission repeater station further comprises at least one first storage device used for recording the electric field signal.

In an embodiment of the system for monitoring and early warning of structural collapse, further comprising at least one transmission repeater station, wherein the electric field signal is transmitted to the data processing unit by the at least one transmission repeater station through wired or wireless transmission.

In an embodiment of the system for monitoring and early warning of structural collapse, wherein the at least one transmission repeater station further comprises at least one first storage device used for recording the electric field signal.

In an embodiment of the system for monitoring and early warning of structural collapse, wherein the warning unit is at least one of a signal light, a speaker, a gate and a monitor.

In an embodiment of the system for monitoring and early warning of structural collapse, wherein the signal analysis includes a Morlet transform or an enhanced Morlet transform.

In an embodiment of the system for monitoring and early warning of structural collapse, wherein the signal analysis includes at least one of a skewness calculation and a kurtosis calculation.

In an embodiment of the system for monitoring and early warning of structural collapse, wherein the critical transition feature includes at least one feature selected from the group consisting of (1)~(8): (1) an intensity of the electric field signal reaches an intensity threshold; (2) an intensity of the electric field signal is continuously greater than a continuous intensity threshold within a continuous time period; (3) an integral value of an intensity of the electric field signal with respect to a time interval reaches an integral value threshold; (4) an integral value of an intensity of the electric field signal with respect to an unit time reaches an unit time integral value threshold; (5) an absolute value of a skewness of an intensity of the electric field signal reaches a skewness threshold; (6) an absolute value of a skewness of an intensity of the electric field signal is continuously greater than a continuous skewness threshold within a continuous skewness time period; (7) a kurtosis of an intensity of the electric field signal reaches a kurtosis threshold; and (8) a kurtosis of an intensity of the electric field signal is continuously greater than a continuous kurtosis threshold within a continuous kurtosis time period.

In an embodiment of the system for monitoring and early warning of structural collapse, wherein the critical transition feature is occurred in the electric field signal within a characteristic frequency range.

In an embodiment of the system for monitoring and early warning of structural collapse, wherein the characteristic frequency range is greater than 0.008 Hz and smaller than 1 Hz.

In an embodiment of the system for monitoring and early warning of structural collapse, wherein the monitoring area is a side-slope, a roadside slope, a retaining wall or a bridge pier.

For further understanding the characteristics and effects of the present invention, some preferred embodiments referred to drawings are in detail described as follows.

DETAILED DESCRIPTIONS OF PREFERRED EMBODIMENTS

One of the main factors of mass wasting phenomenon is the impact of gravity. Due to the uniaxial compressing of gravity, there results in landslide, rockfall, collapse of bridges or bridge piers and so on. When rocks or concretes are compressed by gravity, since the compositions of rocks often containing piezoelectric materials, thereby an electric field signal is generated. Accordingly, applicants firstly do the uniaxial compressive test applying to the rock core of various kinds of rocks to simulate the uniaxial compressing of gravity. And measuring the variation of the electric field signal of the surface of the rock core of various kinds of rocks during the uniaxial compressive test in order to find out the feature before the occurrence of rock core collapse.

Figure 1:
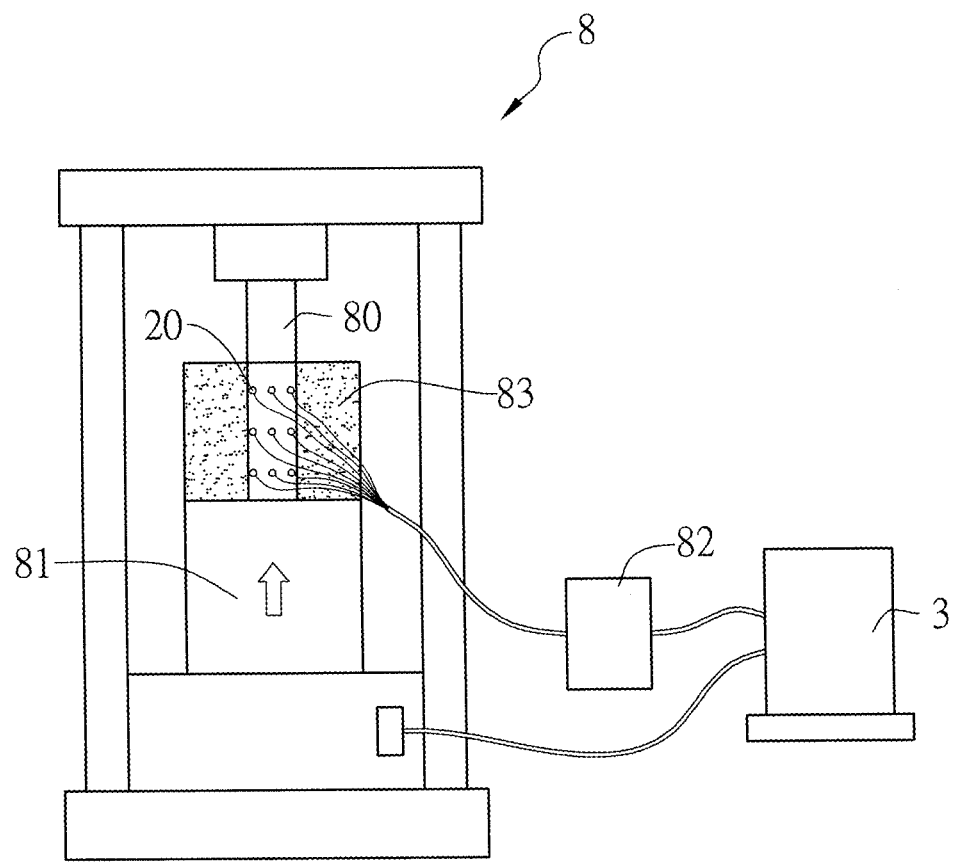
FIG. 1 is an experimental setup diagram of a system for monitoring and early warning of structural collapse and method thereof of the present invention.

Please refer to FIG. 1, which is an experimental setup diagram of a system for monitoring and early warning of structural collapse and method thereof of the present invention. Putting a rock core 80 (generally cylindrical) obtained by drilling on a lift platform 81 of an oil hydraulic compression 8. Installing a plural of electric field sensors 20 on the surface of the rock core 80 and then filling with sand 83 in the acrylic container around the rock core 80 in order to prevent the danger of the fragmentation of the rock core 80 hitting the surrounding objects or people when the rock core 80 broke. In current experiment, the electric field sensor 20 is an electrode. Connecting the plural of electric field sensors 20 (electrodes) to an electric field signal recorder 82. The electric field signal recorder 82 may connect to a data processing unit 3 or may be directly installed inside the data processing unit 3. The data processing unit 3 may be a computer for recording an electric field signal of the surface of the rock core 80 and applying a signal analysis to the electric field signal. During the experiment, firstly raises up the lift platform 81 with a compression rate to compress the rock core 80. When the applied pressure exceeding the compressive strength the rock core 80 broke into fragments of different sizes. Then stops raising the lift platform 81. During the experiment, the variation of the pressure of the uniaxial compression is also recorded.

In the experiment set up of FIG. 1, the plural of electric field sensors 20 (electrodes) may be nondestructively installed on the surface of the rock core 80. For example, firstly coating an electrically conductive silver adhesive on the surface of the rock core 80. After the electrically conductive silver adhesive is completely dried, then soldering a signal line to form an electric field sensor 20 (electrode). Usually the signal line may be the single or multi-core wire(s), or the enameled wire(s).

The rock core 80 used in the experiment set up of FIG. 1 may be various kinds of rock cores or may be concrete for studying the characteristics of various kinds of rock cores or concrete. Among the compositions of various kinds of rocks, quartz is often abundant material. Quartz is the most abundant material having the piezoelectric properties in Earth crust. The quartz crystal, silicon dioxide, is usually formed of the symmetric tetrahedron structure. When the quartz crystal deformed by applied force, the electric dipole moments of the quartz crystal will shorten due to the force compression. Due to the change of the electric dipole moments, the quartz crystal will generate positive and negative charges on the opposite two sides of its surface to generate an electrical potential difference against the change of the electric dipole moments. In addition to quartz, there are also many other compositions having the piezoelectric properties.

Figure 2:
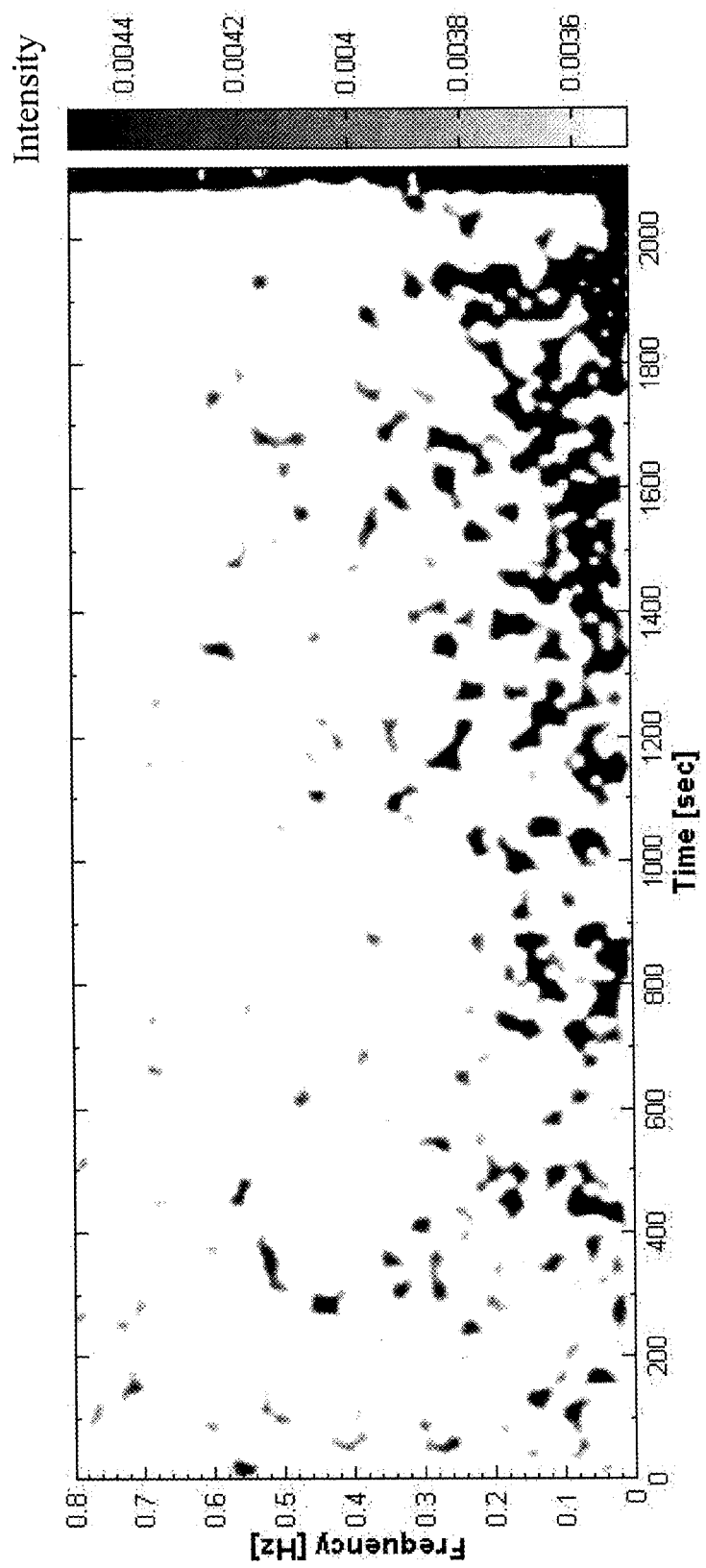
FIG. 2 and FIG. 2A~FIG. 2C are the time-frequency diagrams of the experiment results of a system for monitoring and early warning of structural collapse and method thereof of the present invention.
Figure 2A:
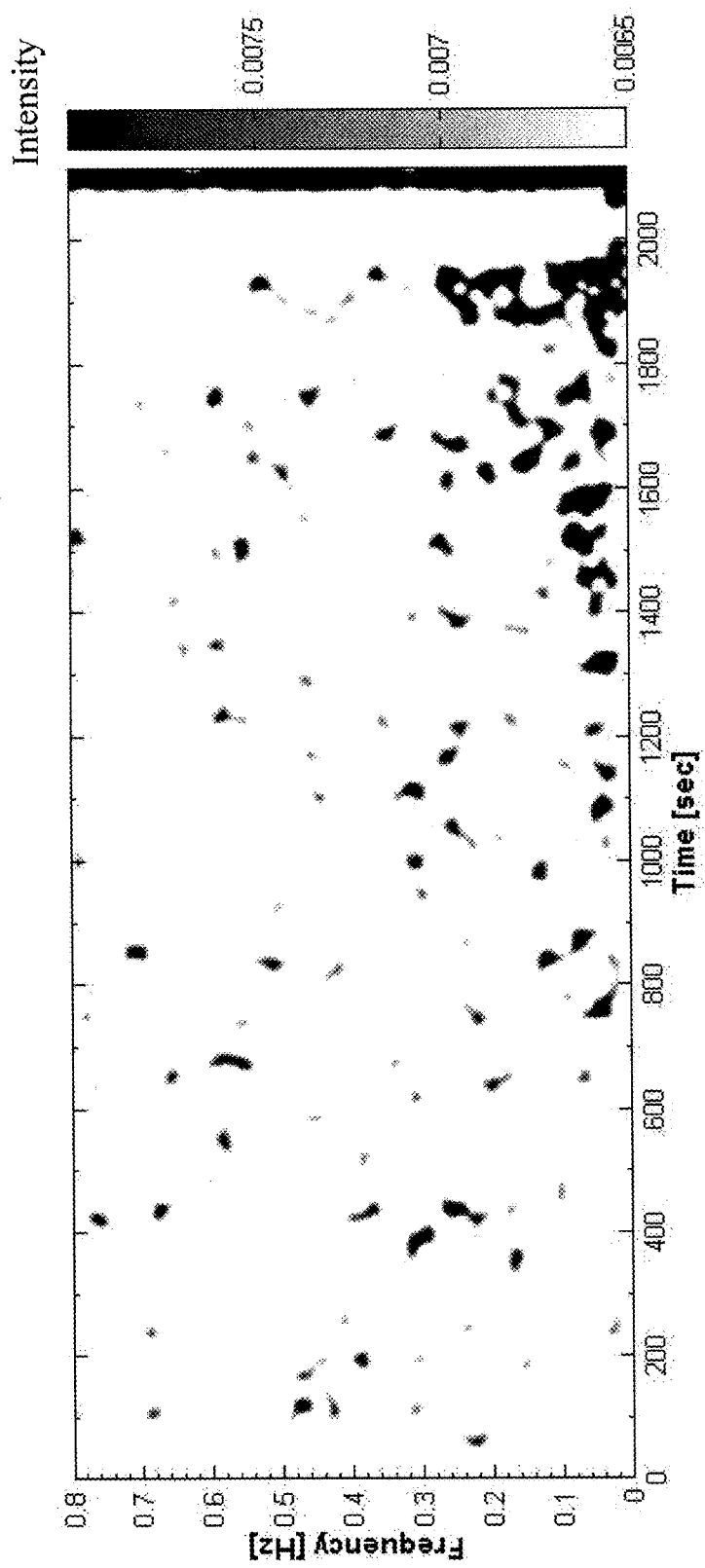
Figure 2B:
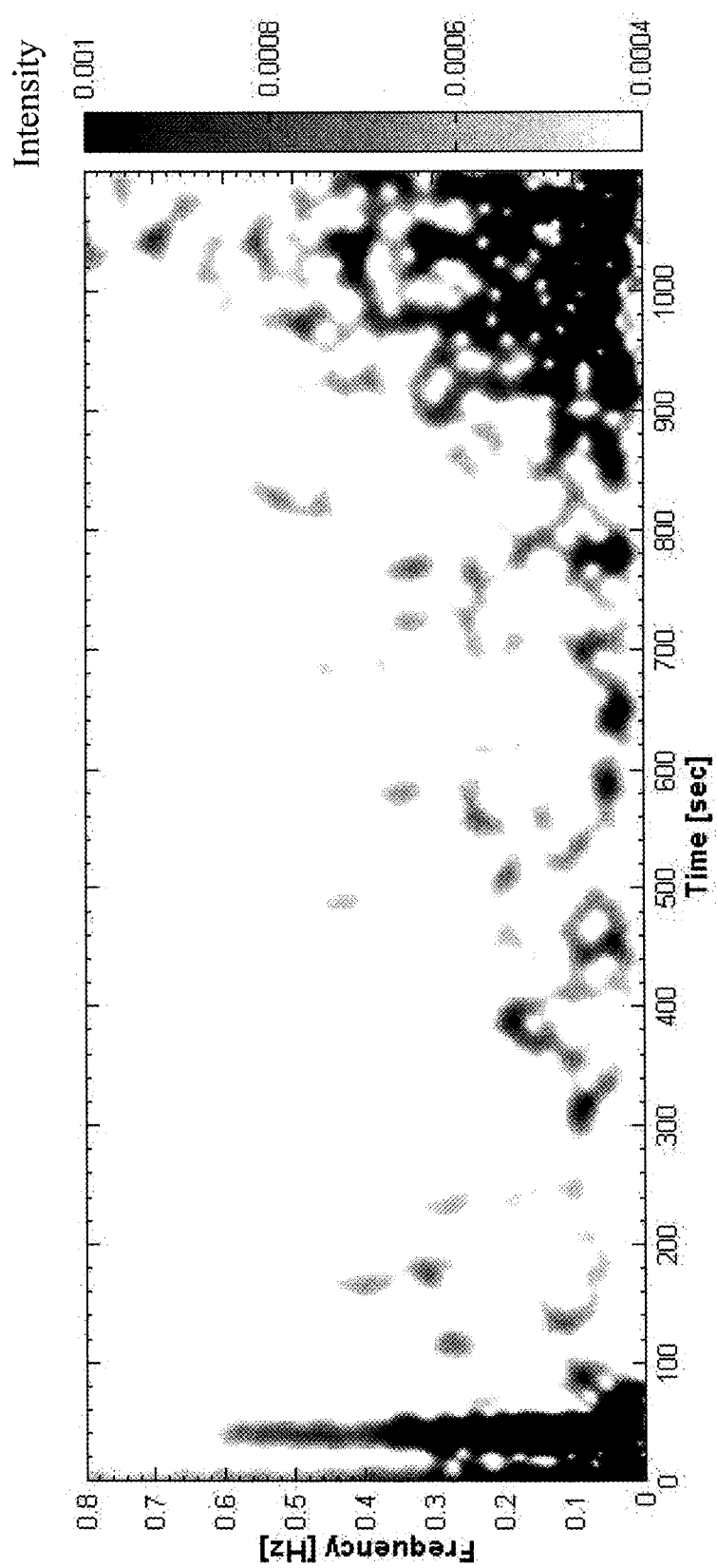
Figure 2C:
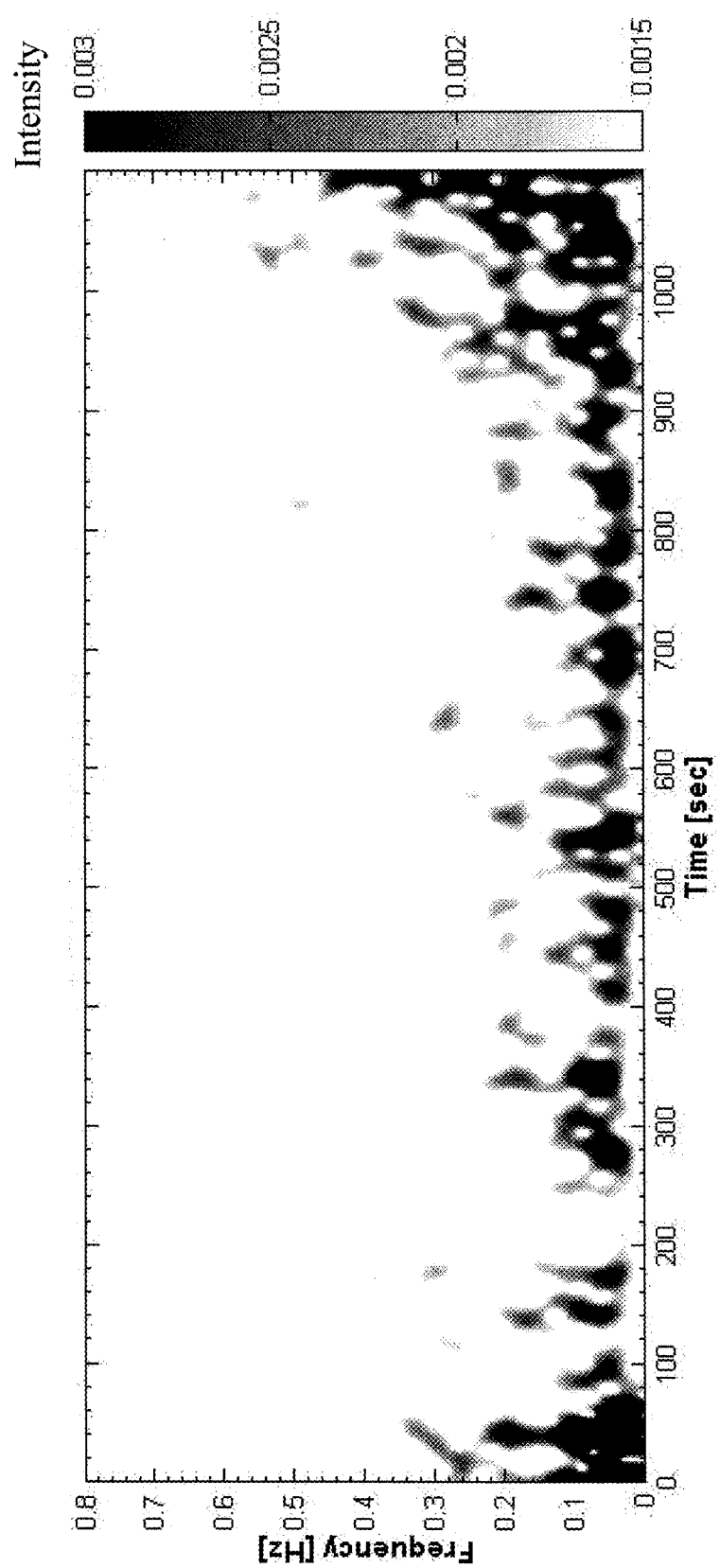

Please refer to FIG. 2~FIG. 2C, which are the time-frequency diagrams of the experiment results of a system for monitoring and early warning of structural collapse and method thereof of the present invention. In FIG. 2~FIG. 2C, the moment the rock core 80 broke is at the end of the timeline. In the experiments, the rock core 80 is a kind of granites, pink granite. After the rock thin section analysis, its main compositions include quartz, plagioclase, muscovite, biotite and etc. When the granite rock core 80 is deformed by force compression, an electrical potential difference will be generated. In the four experiments, the signal analysis applied to the electric field signal includes a time-frequency signal analysis. Firstly, applying a low pass filtering to the electric field signal to remove the high frequency noise from the electric field signal. Then applying an enhanced Morlet transform to the electric field signal such that the electric field signal is converted from the original time domain into frequency domain. After that, demonstrating the diagram of the variation of the frequency and the intensity of the electric field signal with respect to time. In the beginning of compression, the applied force is not uniformly distributed inside the rock core 80. Thus, there will come out some irregular signals. After continuing compressing, the applied force will be uniformly distributed inside the rock core 80 so that there will be no more irregular signals. For example, in FIG. 2B and FIG. 2C, in the beginning 100 seconds of compression, there are some irregular electric field signals with strong intensity. After that, these irregular signals disappear and no longer appear again. While in FIG. 2 and FIG. 2A, there is no obvious irregular signal within the beginning 100 seconds of compression. It is the precursor of the collapse of the rock core 80 that when the intensity of the electric field signals begins varying dramatically within the frequency range from 0.01 Hz to 1 Hz within a short time period before the rock core 80 break into fragments of different sizes. It can be found in FIG. 2~FIG. 2C that the intensity of the electric field signals begins varying dramatically within the frequency range from 0.01 Hz to 1 Hz within a short time period before the rock core 80 break into fragments of different sizes. While the dramatic variation of the intensity of the electric field signals reaches a critical transition feature, it means that the rock core 80 is going to collapse soon. In the case of FIG. 2, the intensity of the electric field signals begins appearing some changes after about 1400 seconds in the time axis while reaches a critical transition feature at about 1800 seconds. In the case of FIG. 2A, the intensity of the electric field signals begins appearing some changes after about 1500 seconds in the time axis while reaches a critical transition feature at about 1900 seconds. In the case of FIG. 2B, the intensity of the electric field signals begins appearing some changes after about 850 seconds in the time axis while reaches a critical transition feature at about 950 seconds. In the case of FIG. 2C, the intensity of the electric field signals begins appearing some changes after about 950 seconds in the time axis while reaches a critical transition feature at about 980 seconds. In each case of FIG. 2~FIG. 2C, there is always a short time difference between the time reaching the critical transition feature and the time the rock core 80 collapse (at the end of the time axis). Hence the feature of collapse may be observed before the rock core 80 collapse. Therefore, when observed the critical transition feature, it may be predictable that the rock core 80 is going to collapse soon. Since the compression force is greater than the gravity in the uniaxial compressive test, hence if the electric field sensors 20 are installed along roadside slope, when detected the critical transition feature, the time difference between the time reaching the critical transition feature and the time roadside slope collapse must be longer than the time difference measured from the experiments. Therefore, there should have enough time to issue an early warning signal to reduce the risk of disasters from threatening human beings.

Figure 3:
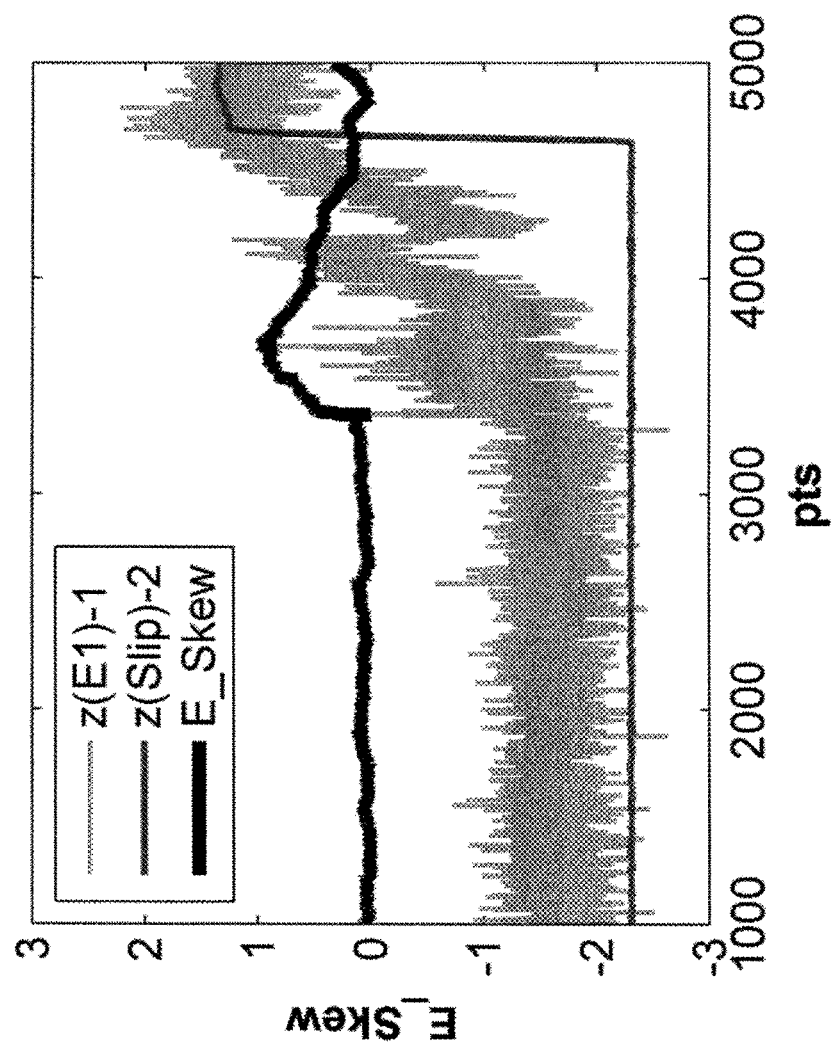
FIG. 3 and FIG. 3A~FIG. 3C are the time domain analysis diagrams of the experiment results of a system for monitoring and early warning of structural collapse and method thereof of the present invention.
Figure 3A:
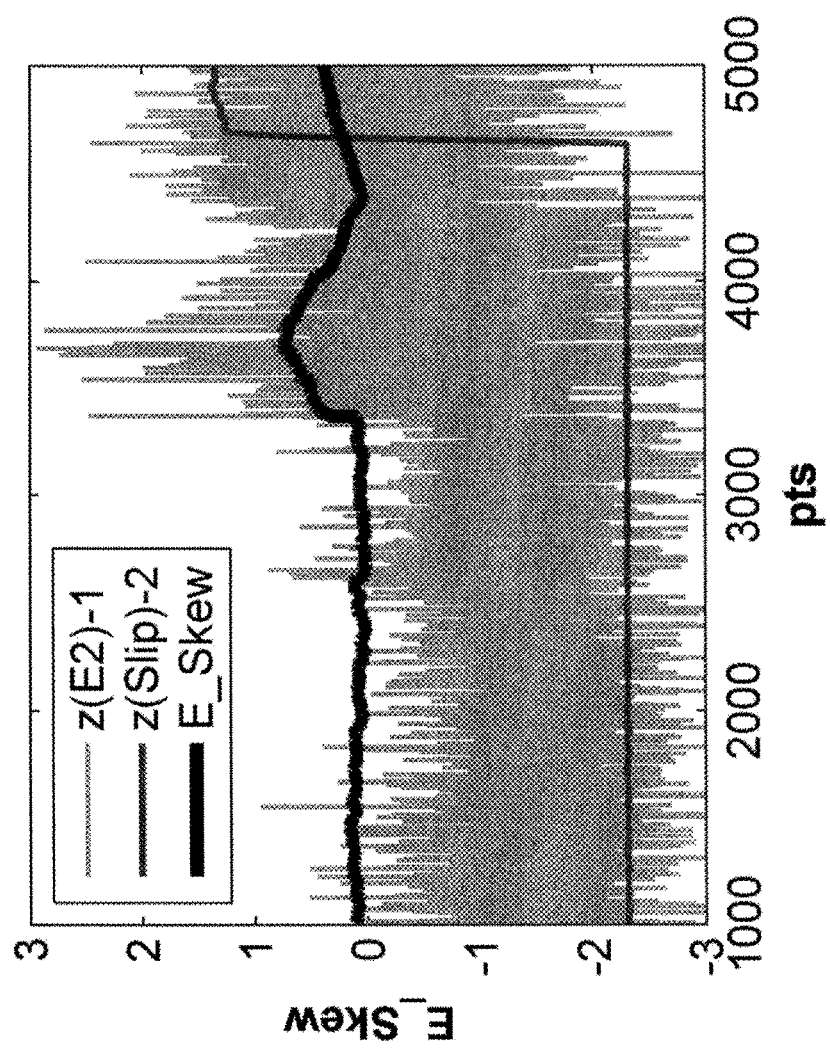
Figure 3B:
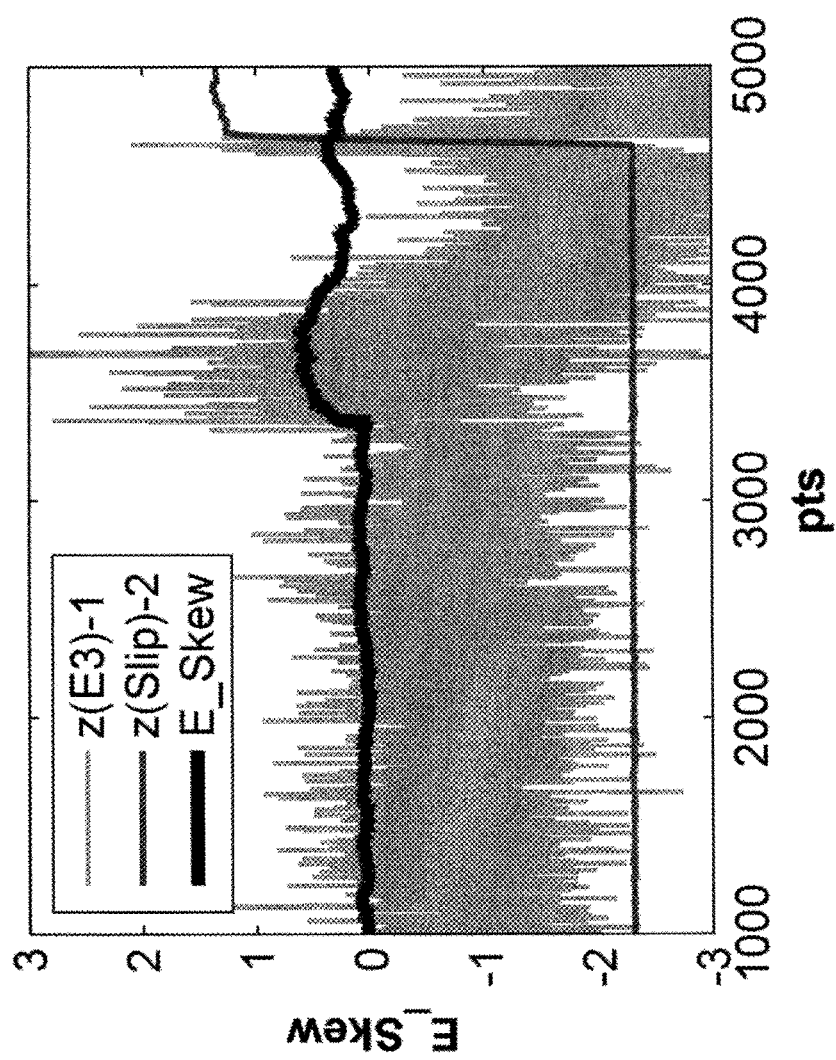
Figure 3C:
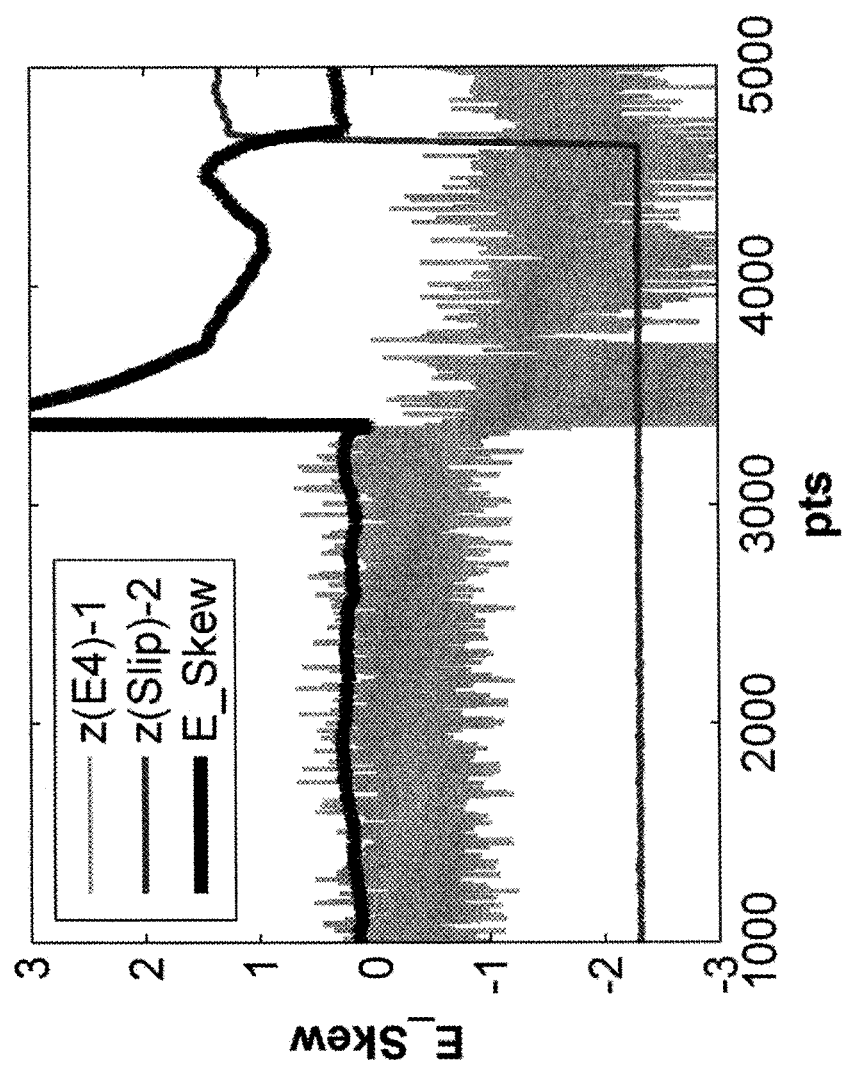

Please refer to FIG. 3~FIG. 3C, which are the time domain analysis diagrams of the experiment results of a system for monitoring and early warning of structural collapse and method thereof of the present invention. In the experiments, the rock core 80 is also a kind of granites. In these four experiments, the signal analysis applied to the electric field signal includes a time domain signal analysis. Firstly, applying a low pass filtering to the electric field signal to remove the high frequency noise from the electric field signal. Then applying a skewness calculation to the electric field signal, capturing the partial result of the range before and after the rock core 80 broke into fragments of different sizes and demonstrating the partial result in the time domain analysis diagram. The time the rock core 80 broke is about the time when the slip increasing in a sudden in the diagram, which is at about 4700 in the horizontal axis. It may be clearly observed from the time domain analysis diagram that the skewness of the intensity of the electric field signal begin to change from near zero to obviously greater than zero, which is at about 3300 in the horizontal axis. Therefore, it may be observed from the time domain analysis diagram that the skewness of the intensity of the electric field signal begin to change before the rock core 80 collapse. When the variation of the skewness of the intensity of the electric field signals reaches a critical transition feature, it may be predictable that the rock core 80 is going to collapse soon.

For different rock cores, or even rock cores of different types of rocks, it can be achieved by applying a normalization operation to the signal analysis to the electric field signal to form a data analysis of a dimensionless quantity.

Figure 4:
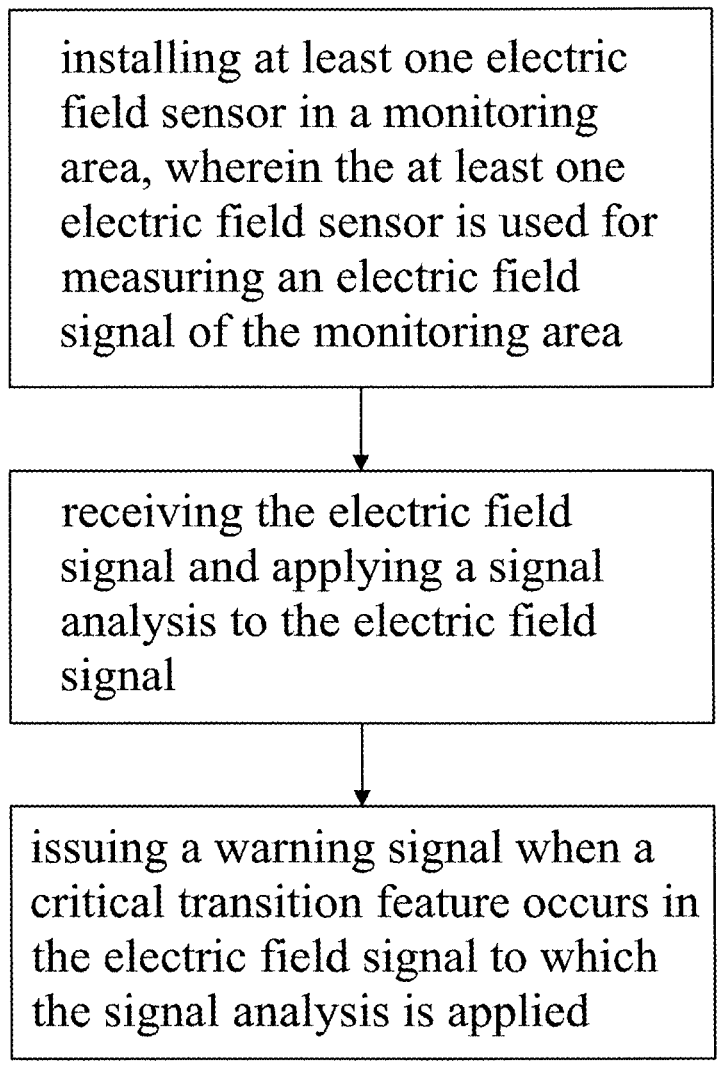
FIG. 4 is a step flow diagram of a method for monitoring and early warning of structural collapse of the present invention.

Please refer to FIG. 4, which is a step flow diagram of a method for monitoring and early warning of structural collapse of the present invention. The method comprises following steps of: installing at least one electric field sensor 20 in a monitoring area 5, wherein the at least one electric field sensor 20 is used for measuring an electric field signal of the monitoring area 5; receiving the electric field signal and applying a signal analysis to the electric field signal; and issuing a warning signal when a critical transition feature occurs in the electric field signal to which the signal analysis is applied. The critical transition feature may include at least one feature selected from the group consisting of (1)~(16): (1) an intensity of the electric field signal within a characteristic frequency (hereafter referred to as CF) range reaches a CF intensity threshold; (2) an intensity of the electric field signal within a CF range is continuously greater than a continuous CF intensity threshold within a continuous CF time period; (3) an integral value of an intensity of the electric field signal within a CF range with respect to a CF time interval reaches a CF integral value threshold; (4) an integral value of an intensity of the electric field signal within a CF range with respect to an unit time reaches an unit time CF integral value threshold; (5) an absolute value of a CF skewness of an intensity of the electric field signal within a CF range reaches a CF skewness threshold; (6) an absolute value of a CF skewness of an intensity of the electric field signal within a CF range is continuously greater than a continuous CF skewness threshold within a continuous CF skewness time period; (7) a CF kurtosis of an intensity of the electric field signal within a CF range reaches a CF kurtosis threshold; (8) a CF kurtosis of an intensity of the electric field signal within a CF range is continuously greater than a continuous CF kurtosis threshold within a continuous CF kurtosis time period; (9) an intensity of the electric field signal reaches an intensity threshold; (10) an intensity of the electric field signal is continuously greater than a continuous intensity threshold within a continuous time period; (11) an integral value of an intensity of the electric field signal with respect to a time interval reaches an integral value threshold; (12) an integral value of an intensity of the electric field signal with respect to an unit time reaches an unit time integral value threshold; (13) an absolute value of a skewness of an intensity of the electric field signal reaches a skewness threshold; (14) an absolute value of a skewness of an intensity of the electric field signal is continuously greater than a continuous skewness threshold within a continuous skewness time period; (15) a kurtosis of an intensity of the electric field signal reaches a kurtosis threshold; and (16) a kurtosis of an intensity of the electric field signal is continuously greater than a continuous kurtosis threshold within a continuous kurtosis time period. The characteristic frequency range is greater than 0.008 Hz and smaller than 1 Hz. Since the critical transition feature may be easily observed from the time-frequency diagram or time domain analysis diagram, therefore, to judge whether the critical transition feature is occurred should not be limited to the above 16 kinds of features. The monitoring area may be a side-slope, a roadside slope, a retaining wall or a bridge pier. Furthermore, the monitoring area may be a wall tile or a building wall. The electric field sensor 20 may be an electrode. Generally, there are three categories of the signal analyses for applying to the electric field signal: a time domain signal analysis, a frequency domain signal analysis and a time-frequency domain signal analysis. The signal analysis may also be performed by firstly applying a time domain signal analysis and then followed by applying a frequency domain signal analysis or a time-frequency domain signal analysis. The time domain signal analysis usually may include a low pass filtering, a normalization operation, a skewness calculation and a kurtosis calculation. The frequency domain signal analysis usually may include a wavelet analysis, a wavelet transform, a mother wavelet transform, a Morlet transform, an enhanced Morlet transform, a time domain to frequency domain transform, a Fourier transform and a fast Fourier transform. The time-frequency domain signal analysis is usually based on the frequency domain signal analysis and then generates the time-frequency diagram.

Figure 5:
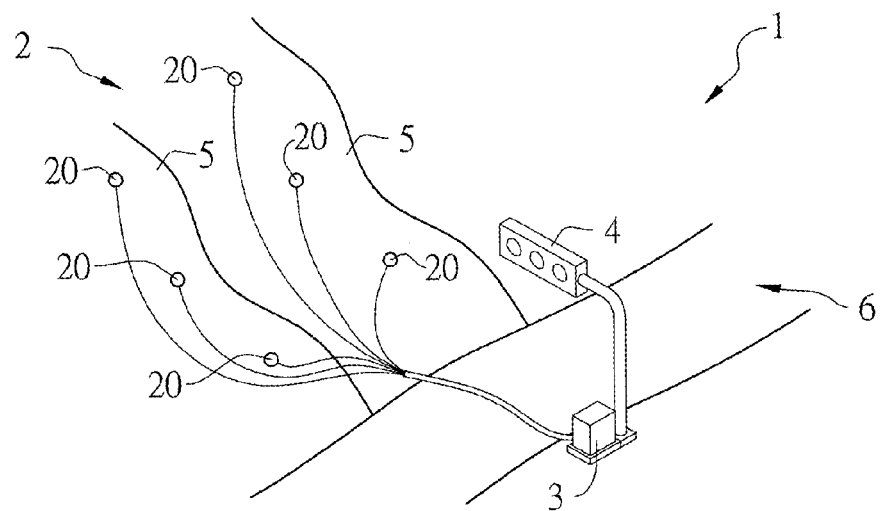
FIG. 5 and FIG. 5A are the embodiments of a system for monitoring and early warning of structural collapse of the present invention.

Please refer to FIG. 5, which is an embodiment of a system for monitoring and early warning of structural collapse of the present invention. The system comprises a detecting unit 2, a data processing unit 3 and a warning unit 4. The detecting unit 2 includes at least one electric field sensor 20, wherein the electric field sensor 20 is installed in a monitoring area 5. The electric field sensor 20 is used for measuring an electric field signal of the monitoring area 5. In current embodiment, the monitoring area 5 is a side-slope. The electric field sensor 20 may be an electrode, a wire, a signal line or an enameled wire. The electric field sensor 20 may be buried in the side-slope of the monitoring area 5. The data processing unit 3 may be a notebook, a computer or a server. The electric field sensor 20 is connected with the data processing unit 3 by wire such that the data processing unit 3 may receive the electric field signal and apply a signal analysis to the electric field signal. The warning unit 4 is connected with the data processing unit 3 through wired or wireless transmission. In current embodiment, the warning unit 4 is a traffic signal. When a critical transition feature occurs in the electric field signal to which the signal analysis is applied, the data processing unit 3 immediately issues a warning signal to the warning unit 4. After received the warning signal, the warning unit 4 executes the operation of the warning unit 4 to control the traffic of the road 6. In other embodiments, the warning unit 4 may be at least one of a signal light, a speaker, a gate and a monitor. The signal analysis applied to the electric field signal is the same as the signal analysis described in the method for monitoring and early warning of structural collapse of the present invention. The critical transition feature is also the same as the critical transition feature described in the method for monitoring and early warning of structural collapse of the present invention. In another embodiment, the monitoring area 5 may be a roadside slope, a retaining wall or a bridge pier. In other embodiment, the monitoring area 5 may be a wall tile or a building wall.

Figure 5A:
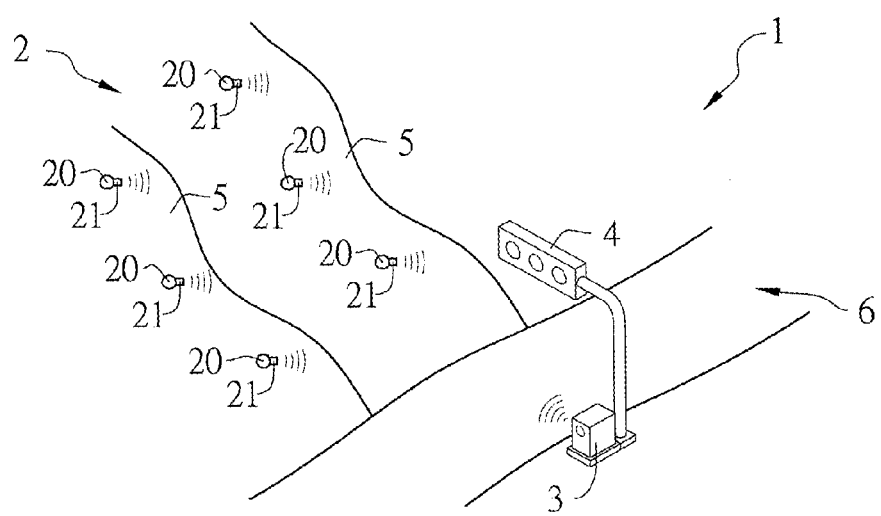
Figure 9:
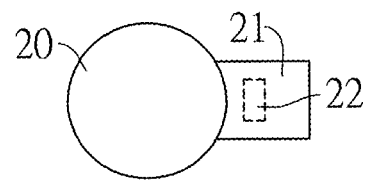
FIG. 9 is the schematic diagram of the detecting unit of an embodiment of a system for monitoring and early warning of structural collapse of the present invention.

Please refer to FIG. 5A, which is another embodiment of a system for monitoring and early warning of structural collapse of the present invention. The main system is mostly similar to the system of the embodiment shown in FIG. 5, except that the detecting unit 2 further comprises at least one transmitter 21. The transmitter 21 is connected with the electric field sensor 20. The electric field signal measured by the electric field sensor 20 is transmitted to the data processing unit 3 by the transmitter 21 through wireless transmission. In another embodiment, the transmitter 21 may further comprise a second storage device 22 (referred to FIG. 9), wherein the second storage device 22 is used for recording the electric field signal.

Figure 6:
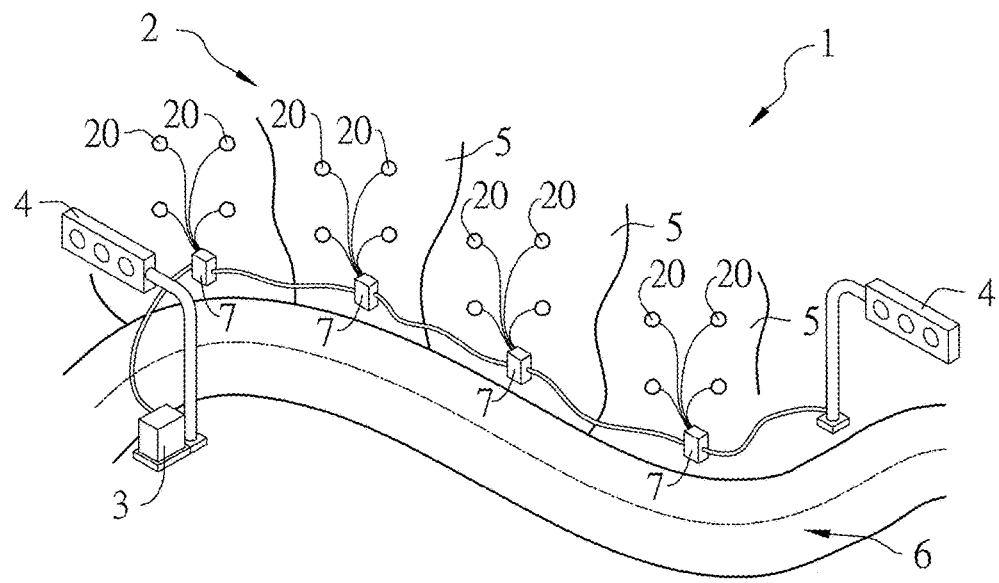
FIG. 6 and FIG. 6A~FIG. 6C are the embodiments of a system for monitoring and early warning of structural collapse of the present invention.
Figure 9A:
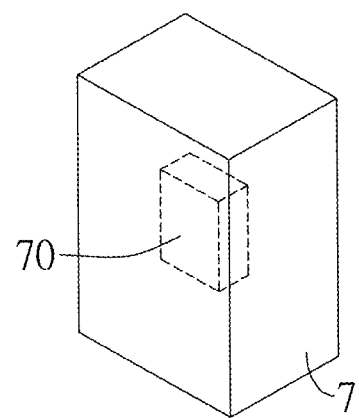
FIG. 9A is the schematic diagram of the transmission repeater station of an embodiment of a system for monitoring and early warning of structural collapse of the present invention.

Please refer to FIG. 6, which is another embodiment of a system for monitoring and early warning of structural collapse of the present invention. The main system is mostly similar to the system of the embodiment shown in FIG. 5, except that it further comprises at least one transmission repeater station 7. The transmission repeater station 7 is connected with the adjacent electric field sensors 20 by wires. The transmission repeater stations 7 are connected to each other by wires. There is at least one transmission repeater station 7 is connected with the data processing unit 3 by wire. The electric field signal is transmitted to the data processing unit 3 by the transmission repeater station 7 through wired transmission. The system comprises at least one warning unit 4. The warning unit 4 is connected with the transmission repeater station 7 or the data processing unit 3. In another embodiment, the transmission repeater station 7 may further comprise a first storage device 70 (referred FIG. 9A), wherein the first storage device 70 is used for recording the electric field signal.

Figure 6A:
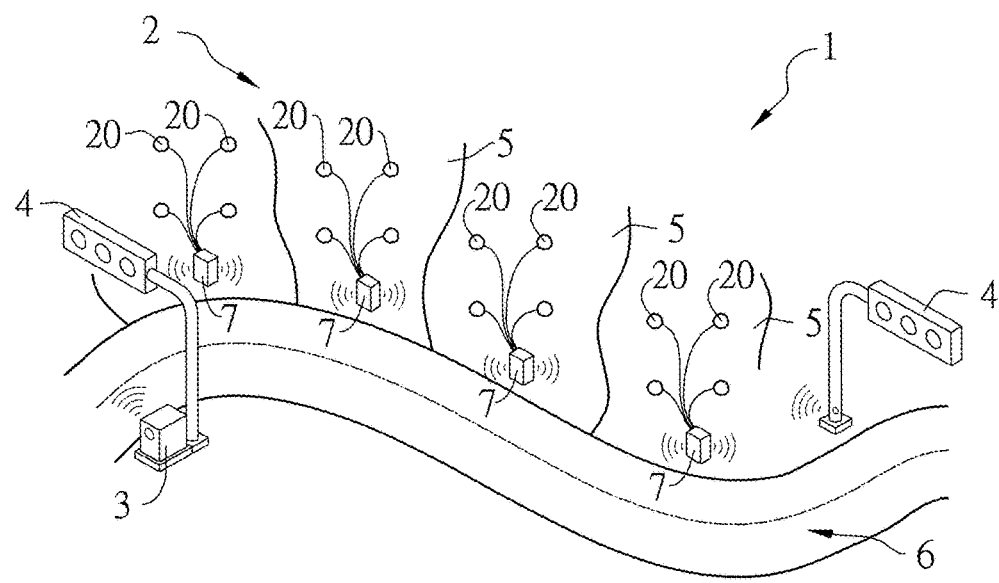

Please refer to FIG. 6A, which is another embodiment of a system for monitoring and early warning of structural collapse of the present invention. The main system is mostly similar to the system of the embodiment shown in FIG. 6, except that the transmission repeater stations 7 are connected to each other through wireless transmission. At least one of the transmission repeater stations 7 is connected with the data processing unit 3 through wireless transmission. The warning unit 4 is connected with the data processing unit 3 or the transmission repeater station 7 through wired or wireless transmission. In another embodiment, the transmission repeater station 7 may further comprise a first storage device 70 (referred FIG. 9A), wherein the first storage device 70 is used for recording the electric field signal.

Figure 6B:
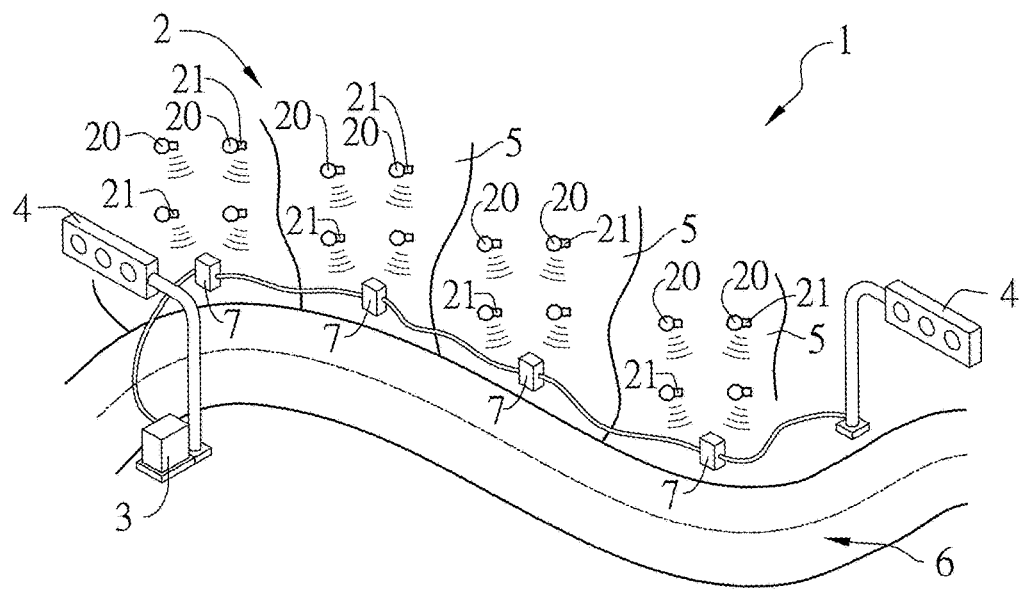

Please refer to FIG. 6B, which is another embodiment of a system for monitoring and early warning of structural collapse of the present invention. The main system is mostly similar to the system of the embodiment shown in FIG. 6, except that the detecting unit 2 further comprises at least one transmitter 21. The transmitter 21 is connected with the electric field sensor 20. The electric field signal measured by the electric field sensor 20 is transmitted to the adjacent transmission repeater station 7 by the transmitter 21 through wireless transmission. In another embodiment, the transmitter 21 may further comprise a second storage device 22 (referred to FIG. 9), wherein the second storage device 22 is used for recording the electric field signal.

Figure 6C:
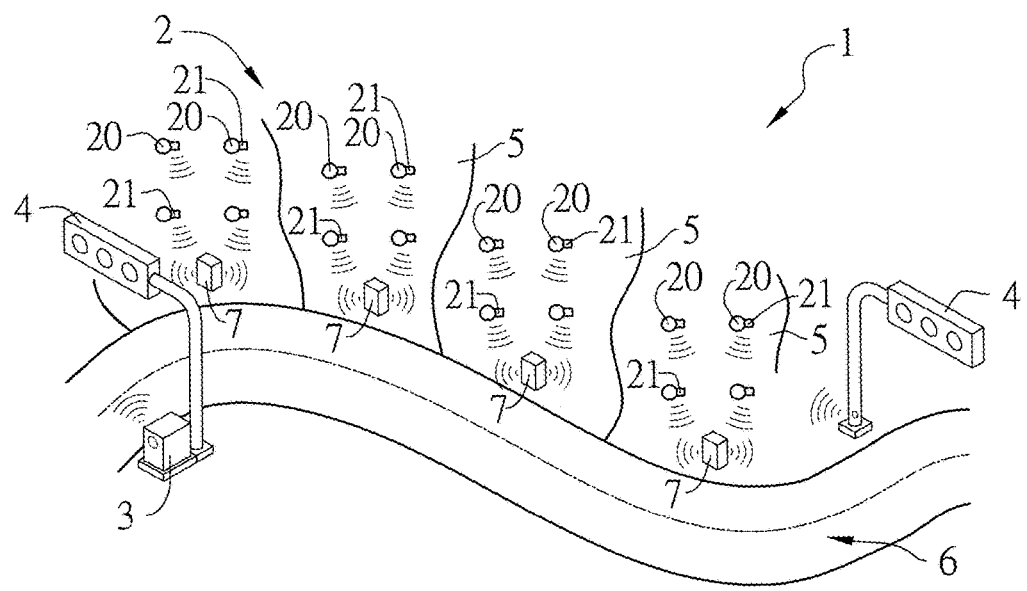

Please refer to FIG. 6C, which is another embodiment of a system for monitoring and early warning of structural collapse of the present invention. The main system is mostly similar to the system of the embodiment shown in FIG. 6B, except that the transmission repeater stations 7 are connected to each other through wireless transmission. At least one of the transmission repeater stations 7 is connected with the data processing unit 3 through wireless transmission. The warning unit 4 is connected with the data processing unit 3 or the transmission repeater station 7 through wired or wireless transmission. In another embodiment, the transmission repeater station 7 may further comprise a first storage device 70 (referred FIG. 9A), wherein the first storage device 70 is used for recording the electric field signal.

Figure 7:
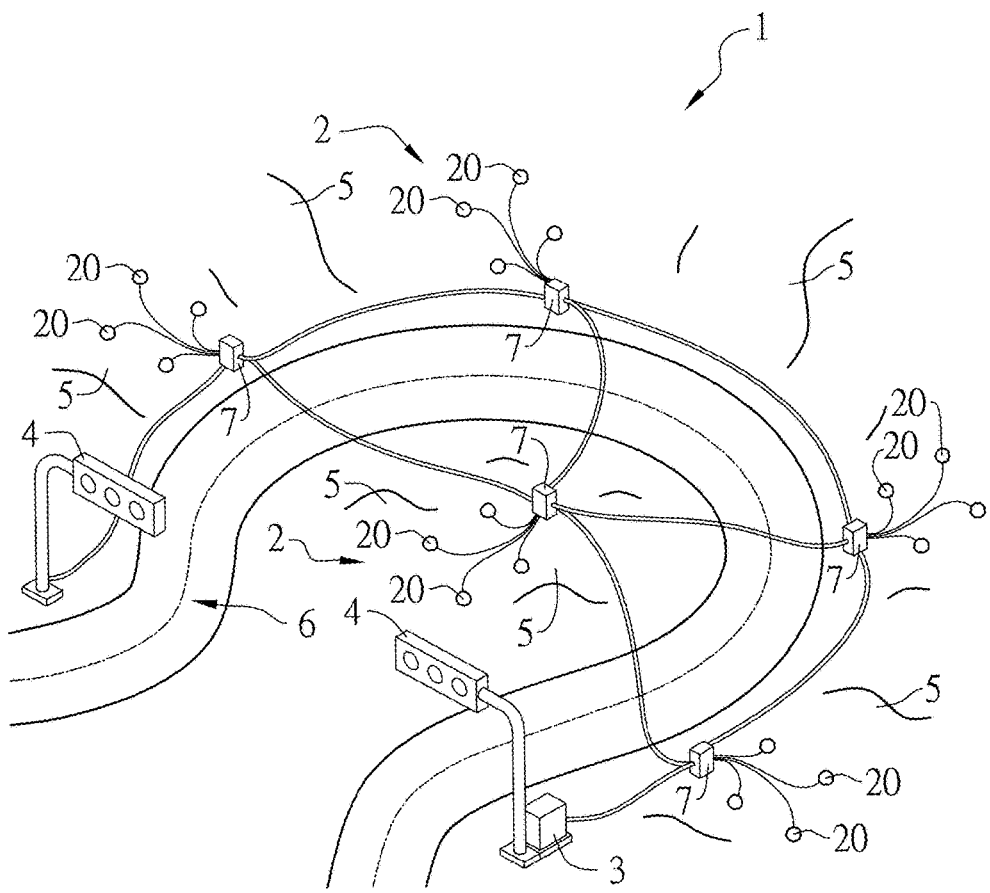
FIG. 7 and FIG. 7A are the embodiments of a system for monitoring and early warning of structural collapse of the present invention.

Please refer to FIG. 7, which is another embodiment of a system for monitoring and early warning of structural collapse of the present invention. The main system is mostly similar to the system of the embodiment shown in FIG. 6, except that the monitoring area 5 includes the side-slope of both sides of the road 6 and the connection between the transmission repeater stations 7 forms a network distribution (in the embodiment of FIG. 6, the connection between the transmission repeater stations 7 forms a chain distribution). In another embodiment, the connection between the transmission repeater stations 7 may include at least one of a network distribution, a star distribution and a chain distribution. In another embodiment, the connection between the transmission repeater stations 7 may combine at least two of a network distribution, a star distribution and a chain distribution.

Figure 7A:
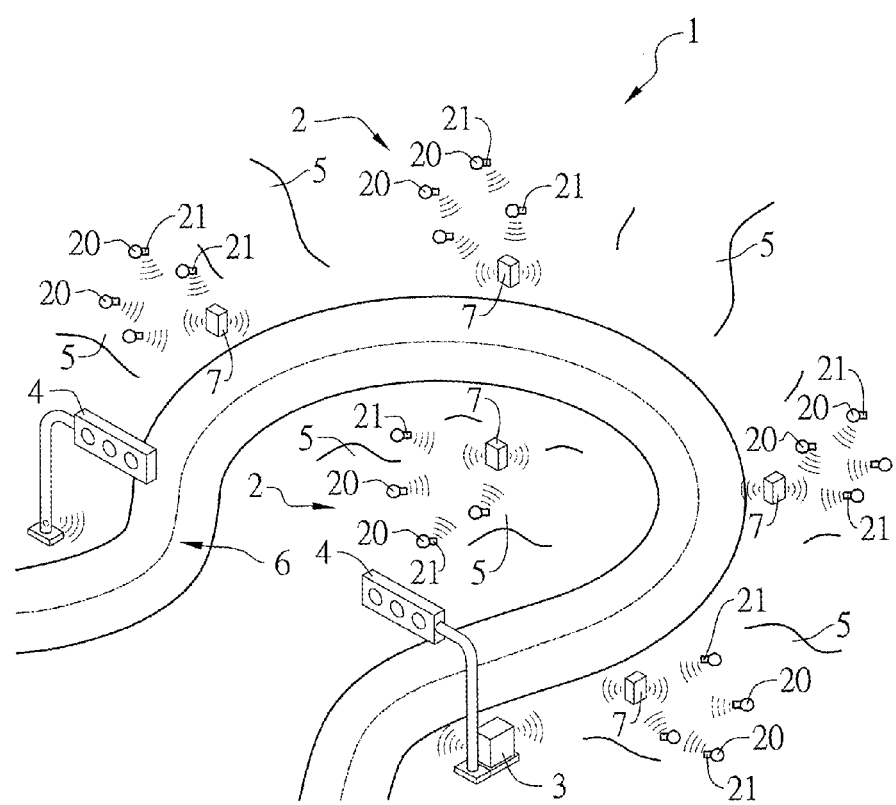

Please refer to FIG. 7A, which is an embodiment of a system for monitoring and early warning of structural collapse of the present invention. The main system is mostly similar to the system of the embodiment shown in FIG. 7, except that the detecting unit 2 further comprises at least one transmitter 21. The transmitter 21 is connected with electric field sensor 20. The transmitter 21 is used to transmit the electric field signal measured by the electric field sensor 20 to the adjacent transmission repeater station 7 through wireless transmission. The transmission repeater stations 7 are connected to each other through wireless transmission. At least one of the transmission repeater stations 7 is connected with the data processing unit 3 through wireless transmission. The warning unit 4 is connected with the data processing unit 3 or the transmission repeater stations 7 through wired or wireless transmission. In another embodiment, the transmitter 21 may further comprise a second storage device 22 (referred to FIG. 9), wherein the second storage device 22 is used for recording the electric field signal. In one other embodiment, the transmission repeater stations 7 may further comprise a first storage device 70 (referred to FIG. 9A), wherein the first storage device 70 is used for recording the electric field signal.

Figure 8:
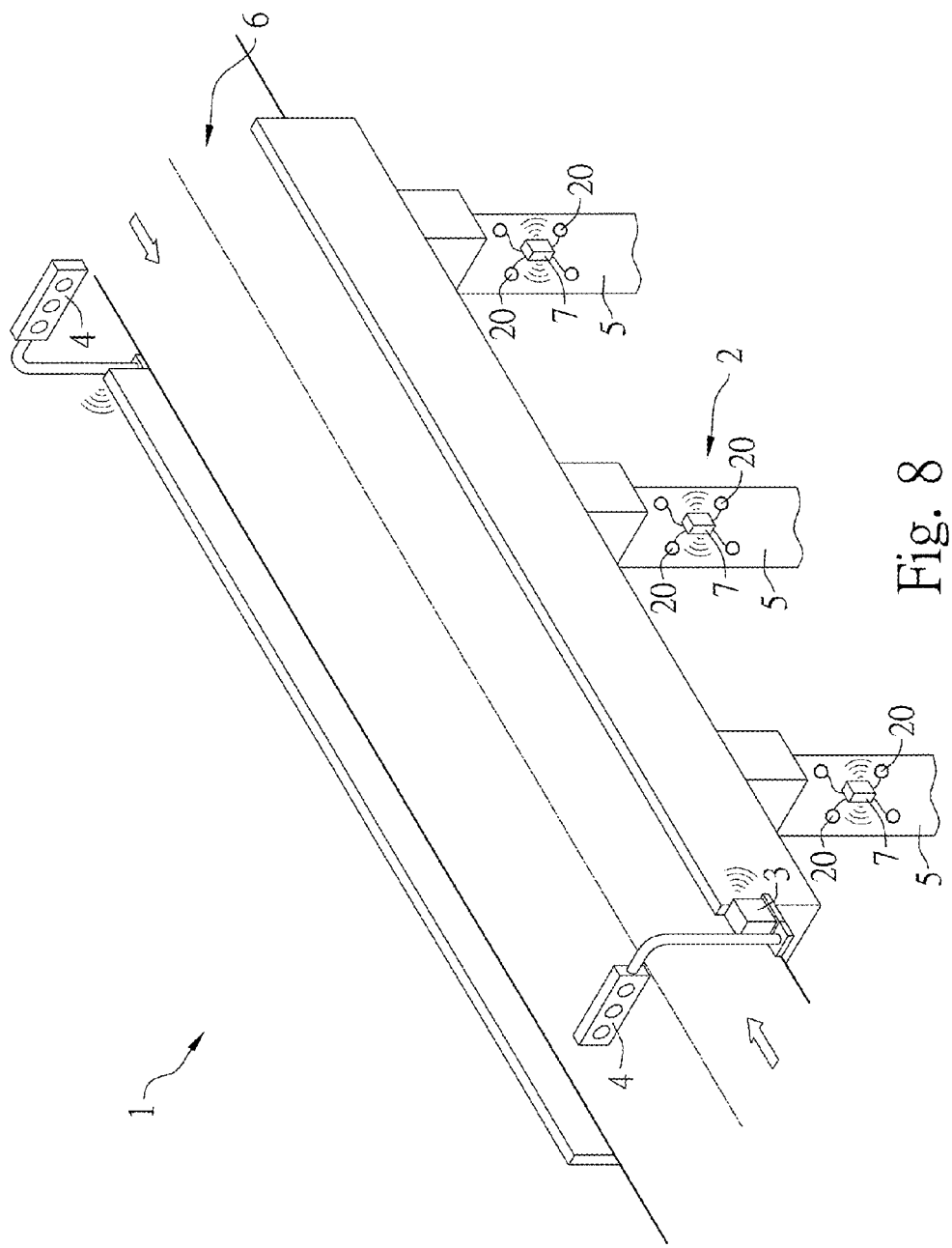
FIG. 8 is an embodiment of a system for monitoring and early warning of structural collapse of the present invention.

Please refer to FIG. 8, which is an embodiment of a system for monitoring and early warning of structural collapse of the present invention. The main system is mostly similar to the system of the embodiment shown in FIG. 6A, except that the monitoring area 5 is a bridge pier.

As disclosed in the above description and attached drawings, the present invention can provide a system for monitoring and early warning of structural collapse and method thereof. It is new and can be put into industrial use.

Although the embodiments of the present invention have been described in detail, many modifications and variations may be made by those skilled in the art from the teachings disclosed hereinabove. Therefore, it should be understood that any modification and variation equivalent to the spirit of the present invention be regarded to fall into the scope defined by the appended claims.

What is claimed is:

1. A method for monitoring and early warning of structural collapse, comprising following steps of:
    installing at least one electric field sensor in a monitoring area, wherein said at least one electric field sensor is used for measuring an electric field signal of said monitoring area;
    receiving said electric field signal and applying a signal analysis to said electric field signal, wherein said signal analysis includes a frequency domain signal analysis; and
    issuing a warning signal when a critical transition feature occurs in said electric field signal to which said signal analysis is applied, wherein said critical transition feature includes at least one feature selected from the group consisting of (1)~(4): (1) a intensity of said electric field signal within a characteristic frequency range reaches a characteristic frequency intensity threshold, wherein said characteristic frequency range is greater than 0.008 Hz and smaller than 1 Hz; (2) a intensity of said electric field signal within a characteristic frequency range is continuously greater than a continuous characteristic frequency intensity threshold within a continuous characteristic frequency time period, wherein said characteristic frequency range is greater than 0.008 Hz and smaller than 1 Hz; (3) an integral value of a intensity of said electric field signal within a characteristic frequency range with respect to a characteristic frequency time interval reaches a characteristic frequency integral value threshold, wherein said characteristic frequency range is greater than 0.008 Hz and smaller than 1 Hz; and (4) an integral value of a intensity of said electric field signal within a characteristic frequency range with respect to an unit time reaches an unit time characteristic frequency integral value threshold, wherein said characteristic frequency range is greater than 0.008 Hz and smaller than 1 Hz.

2. The method for monitoring and early warning of structural collapse according to claim 1, wherein said signal analysis includes a Morlet transform or an enhanced Morlet transform.

3. The method for monitoring and early warning of structural collapse according to claim 1, wherein said monitoring area is a side-slope, a retaining wall or a bridge pier.

4. A method for monitoring and early warning of structural collapse, comprising following steps of:
    installing at least one electric field sensor in a monitoring area, wherein said at least one electric field sensor is used for measuring an electric field signal of said monitoring area;
    receiving said electric field signal and applying a signal analysis to said electric field signal, wherein said signal analysis includes at least one of a skewness calculation and a kurtosis calculation; and
    issuing a warning signal when a critical transition feature occurs in said electric field signal to which said signal analysis is applied, wherein said critical transition feature includes at least one feature selected from the group consisting of (1)~(4): (1) an absolute value of a skewness of an intensity of said electric field signal reaches a skewness threshold; (2) an absolute value of a skewness of an intensity of said electric field signal is continuously greater than a continuous skewness threshold within a continuous skewness time period; (3) a kurtosis of an intensity of said electric field signal reaches a kurtosis threshold; and (4) a kurtosis of an intensity of said electric field signal is continuously greater than a continuous kurtosis threshold within a continuous kurtosis time period.

5. The method for monitoring and early warning of structural collapse according to claim 4, wherein said monitoring area is a side-slope, a retaining wall or a bridge pier.

6. A system for monitoring and early warning of structural collapse comprising:
    a detecting unit including at least one electric field sensor, wherein said at least one electric field sensor is installed in a monitoring area, said at least one electric field sensor is used for measuring an electric field signal of said monitoring area;
    at least one transmission repeater station;
    a data processing unit, wherein said electric field signal is transmitted to said data processing unit by said at least one transmission repeater station through wired or wireless transmission, applying a signal analysis to said electric field signal, and issuing a warning signal when a critical transition feature occurs in said electric field signal to which said signal analysis is applied; and
    a warning unit receiving said warning signal to execute the operation of said warning unit.

7. The system for monitoring and early warning of structural collapse according to claim 6, wherein said monitoring area is a side-slope, a retaining wall or a bridge pier.

8. The system for monitoring and early warning of structural collapse according to claim 6, wherein said signal analysis includes at least one of a skewness calculation and a kurtosis calculation.

9. The system for monitoring and early warning of structural collapse according to claim 6, wherein said detecting unit further comprises at least one transmitter, said electric field signal is transmitted to said data processing unit by said at least one transmitter through wired or wireless transmission.

10. The system for monitoring and early warning of structural collapse according to claim 9, wherein said electric field signal is transmitted to said data processing unit by said at least one transmitter and said at least one transmission repeater station through wired or wireless transmission.

11. The system for monitoring and early warning of structural collapse according to claim 10, wherein said at least one transmission repeater station further comprises at least one first storage device used for recording said electric field signal.

12. The system for monitoring and early warning of structural collapse according to claim 6, wherein said critical transition feature includes at least one feature selected from the group consisting of (1)~(8): (1) an intensity of said electric field signal reaches an intensity threshold; (2) an intensity of said electric field signal is continuously greater than a continuous intensity threshold within a continuous time period; (3) an integral value of an intensity of said electric field signal with respect to a time interval reaches an integral value threshold; (4) an integral value of an intensity of said electric field signal with respect to an unit time reaches an unit time integral value threshold; (5) an absolute value of a skewness of an intensity of said electric field signal reaches a skewness threshold; (6) an absolute value of a skewness of an intensity of said electric field signal is continuously greater than a continuous skewness threshold within a continuous skewness time period; (7) a kurtosis of an intensity of said electric field signal reaches a kurtosis threshold; and (8) a kurtosis of an intensity of said electric field signal is continuously greater than a continuous kurtosis threshold within a continuous kurtosis time period.

13. The system for monitoring and early warning of structural collapse according to claim 6, wherein said at least one transmission repeater station further comprises at least one first storage device used for recording said electric field signal.

14. The system for monitoring and early warning of structural collapse according to claim 6, wherein said warning unit is at least one of a signal light, a speaker, a gate and a monitor.

15. The system for monitoring and early warning of structural collapse according to claim 6, wherein said signal analysis includes a Morlet transform or an enhanced Morlet transform.

16. The system for monitoring and early warning of structural collapse according to claim 12, wherein said critical transition feature is occurred in said electric field signal within a characteristic frequency range.

17. The system for monitoring and early warning of structural collapse according to claim 16, wherein said characteristic frequency range is greater than 0.008 Hz and smaller than 1 Hz.

* * * * *